United States Patent [19]

Yamamoto et al.

[11] Patent Number: 5,318,874
[45] Date of Patent: Jun. 7, 1994

[54] O-NAPHTHOQUINONE DIAZIDE PHOTOSENSITIVE COATING COMPOSITION CONTAINING A POLYVINYL PYRROLIDONE COMPOUND AND A STANNIC HALIDE

[75] Inventors: Shinichi Yamamoto, Yashio; Masatoshi Tomiki, Koshigaya; Naohiko Kiryu, Urawa; Akiko Yamazaki, Soka, all of Japan

[73] Assignee: Somar Corporation, Japan

[21] Appl. No.: 857,415

[22] Filed: Mar. 25, 1992

[30] Foreign Application Priority Data

Jun. 28, 1991 [JP] Japan ................. 3-185214

[51] Int. Cl.⁵ .................... G03F 7/023; G03C 1/61
[52] U.S. Cl. .................... 430/191; 430/165; 430/192
[58] Field of Search ............. 430/191, 178, 165, 192

[56] References Cited

U.S. PATENT DOCUMENTS

| | | | |
|---|---|---|---|
| 4,076,537 | 2/1978 | Tsaboi | 430/178 |
| 4,632,891 | 12/1986 | Banks et al. | 430/190 |

OTHER PUBLICATIONS

Patent Abstracts of Japan, vol. 11, No. 32 (P541) Jan. 1987.
Patent Abstracts of Japan, vol. 6, No. 88 (P-118) May, 1982.
Patent Abstracts of Japan, vol. 14, No. 233 (P-1049) May 1990.

*Primary Examiner*—Charles L. Bowers, Jr.
*Assistant Examiner*—Christopher G. Young
*Attorney, Agent, or Firm*—Lorusso & Loud

[57] ABSTRACT

A composition for forming a photosensitive coating is disclosed which includes:
 (a) a photosensitive agent which is an o-naphthoquinone diazide compound,
 (b) a polyvinylpyrrolidone compound, and
 (c) a stannic halide, wherein the o-naphthoquinone diazide compound is present in an amount of 5-50 parts by weight per 100 parts by weight of the polyvinylpyrrolidone compound and the stannic halide is present in an amount of 4-40% based on the weight of the o-naphthoquinone diazide compound.

4 Claims, No Drawings

O-NAPHTHOQUINONE DIAZIDE PHOTOSENSITIVE COATING COMPOSITION CONTAINING A POLYVINYL PYRROLIDONE COMPOUND AND A STANNIC HALIDE

This invention relates to a composition for forming a photosensitive coating on a substrate and, more particularly, to a coating composition useful for forming positive patterns by exposure and development treatments.

Japanese Published Unexamined Patent Application No. 61-203,449 discloses a coating composition for forming a photosensitive coating capable of giving a positive pattern. This composition is in the form of an organic solvent solution containing 5–50 parts by weight of an o-naphthoquinone diazide compound, and 100 parts by weight of a polyvinylpyrrolidone compound. The coating composition is advantageous because the exposed surface can be developed using a neutral or slightly alkaline solution and because the photosensitive coating obtained therefrom is able to give a positive pattern which can be colored with a dye. However, the known coating composition has been found to pose a problem because the exposed surface is so unstable that when the development is performed after a few hours from the exposure, the background of the pattern-bearing surface is apt to fog.

The present invention has been made with the foregoing problem of the known coating composition in view. In accordance with the present invention there is provided a composition for forming a photosensitive coating, comprising:

(a) a photosensitive agent which is an o-naphthoquinone diazide compound, (b) a polyvinylpyrrolidone compound, and (c) a stannic halide, wherein said o-naphthoquinone diazide compound is present in an amount of 5–50 parts by weight per 100 parts by weight of said polyvinylpyrrolidone compound and said stannic halide is present in an amount of 4–40% based on the weight of said o-naphthoquinone diazide compound.

The composition according to the present invention is applied on a substrate to form a photosensitive coating thereon. This coating gives a clear, positive pattern or image by exposure and development treatments. More particularly, when the photosensitive coating is exposed with UV rays, the exposed area is decomposed. Upon the development treatment with a neutral or slightly alkaline aqueous solution having a pH of 6–8, the decomposed area is dissolved and removed from the substrate to give the positive pattern. The pattern thus formed can be colored with a dye. Further, when the development is effected with a weakly alkaline solution, the pattern is colored without using a dye. The coating composition is stable and has a good shelf life. Furthermore, the coating composition has a significant advantage that the exposed coating obtained therefrom is very stable and retains its good sensitivity for a long period of time. Thus, even when the development is performed, for example, 24 hours after the exposure, there is obtainable a clear image free of fog.

The present invention will now be described in detail below.

Any o-naphthoquinone diazide compound conventionally used for positive pattern-forming photosensitive coating compositions may be used. Such an o-naphthoquinone diazide compound is generally substantially insoluble in water (inclusive of a boiling water) but soluble in organic solvents. Examples of such diazide compounds include an ester obtained by reaction of 1,2-naphthoquinonediazide-4-sulfonic chloride with a m-cresol novolak resin or a phenol novolak resin, an ester obtained by reaction of 1,2-naphthoquinonediazide-5-sulfonic chloride with a m-cresol novolak resin or a phenol novolak resin, a 1,2-naphthoquinonediazide-5-sulfonic acid ester and 1,2-naphthoquinonediazide-5-sulfonic acid amide. o-Naphthoquinone diazide compounds disclosed in, for example, Japanese Examined Patent Publications Nos. 37-13109, 38-012083, 45-5604 and 51-13013 and Japanese Published Unexamined Patent Applications Nos. 47-5303, 48-63802 and 49-38701 may also be used. These photosensitive compounds may be used singly or in combination of two or more thereof.

The above-described photosensitive compound is used together with a binder. As the binder, a homopolymer or a copolymer of vinylpyrrolidone having a viscosity-average molecular weight of at least about 18,000, preferably at least about 30,000 is suitably used. Examples of suitable binders include polyvinylpyrrolidone homopolymers, vinylpyrrolidonevinyl acetate copolymers (vinylpyrrolidone content: 50 mole % or more), vinylpyrrolidone-dimethylaminoethyl methacrylate copolymers and salts thereof. These polymers may be used singly or as a mixture of two or more thereof. It is preferred that a relatively low molecular weight vinylpyrrolidone homopolymer or copolymer with a viscosity-average molecular weight of about 100,000 or less (for example, about 40,000) and a relatively high molecular weight vinylpyrrolidone homopolymer or copolymer with a viscosity-average molecular weight of about 500,000 or more (for example, about 630,000) be used in combination, with a mixing ratio of the former to the latter of 0.3:1 to 6:1, preferably 1:1 to 4:1, since the UV-exposed area of the resulting photosensitive layer exhibits excellent wash-out property in the developing step with a high degree of resolution.

The above o-naphtoquinonediazide compound (photosensitive material) is used in an amount of 5–50 parts by weight, preferably 15–35 parts by weight per 100 parts by weight of the vinylpyrrolidone polymer (binder). Too small an amount of the o-naphthoquinonediazide compound below 5 parts by weight is disadvantageous because a clear image is not obtainable. On the other hand, when the amount of the o-naphthoquinonediazide compound is greater than 50 parts by weight, the exposed area becomes poor in wash-out property and the developed image becomes difficult to dye.

The gist of the present invention resides in the incorporation of a specific stabilizer, i.e. stannic halide, into the coating composition. The preferred stabilizer are stannic chloride (SnCl$_4$) and stannic bromide (SnBr$_4$). The stannic halide is used in an amount of 4–40% by weight, preferably 6–30% by weight, based on the weight of the o-naphthoquinone diazide compound used. An amount of the stannic halide smaller than 4% by weight is insufficient to obtain the stabilizing effect. When the amount of the stannic halide exceeds 40% by weight, it is difficult to prepare a homogeneous coating composition.

The photosensitive layer can contain an adjuvant binder other than the vinylpyrrolidone polymer. Illustrative of suitable adjuvant binder are phenol novolak resins, cresol novolak resins, styrene-maleic anhydride copolymers and polyvinylphenol. Such an adjuvant binder is used in an amount of 50% or less based on the total weight of the azide compound and the pyrrolidone polymer. When the amount of the adjuvant binder exceeds 50% by weight, it becomes difficult to color the developed image. In addition, it becomes necessary to develop the exposed image using a strong alkaline liquid. When the adjuvant binder is used in the above specified amount, on the other hand, the development may be effected with a neutral or weakly alkaline developing liquid and the coloring may be effected without difficulties.

The photosensitive layer can contain various other additives such as a preservability improving agent, a dye or pigment, a photosensitizer and a filler. Further, an organic acid such as palmitic acid, stearic acid or oxalic acid, an inorganic acid such as phosphoric acid, or an acid anhydride such as phthalic anhydride or tetrahydrophthalic anhydride may be also incorporated into the coating composition for improving stability of the photosensitive coating obtained from the composition of the present invention.

The above coating composition may be prepared as follows. First, a predetermined amount of a vinyl pyrrolidone polymer is dissolved in a suitable organic solvent such as an alcohol, a ketone, a halogenated hydrocarbon or a glycol to form a solution with a concentration of, for example, 5% by weight. To the solution were then mixed an o-naphthoquinone diazide, a stannic halide and, as desired, the above-described additives to form a coating solution.

The coating solution is applied to a substrate by any known method such as a roll coating method, a bar coating method, a brush coating method or a spray coating method to form a photosensitive layer with a thickness (after drying) of about 1-5, preferably about 2 $\mu$m. The drying may be effected with ambient air or with a hot air at about 80° C. for about 1 minute.

As the substrate, there may be used a sheet or film of a thermoplastic or thermosetting resin, a glass plate or a metal plate. These sheets or plates may be coated with a primer or matte layer, if desired. Examples of the thermoplastic resins to be used as the substrate include polyethylene terephthalates, polycarbonates, polyamides, polypropylenes, polyvinyl chlorides, polystyrenes, polymethacrylates, copolymers of these polymers and cellulose derivatives such as diacetyl cellulose, triacetyl cellulose, propyl cellulose and mixed cellulose esters.

In use, the coating composition is applied onto a substrate to form a photosensitive layer. Then, an original is placed on the photosensitive layer and UV rays are irradiated to effect exposure. The exposed material is then developed in any of the following manners:

(1) The entire exposed surface is colored with a dye, washed with running water and dried;

(2) The exposed material is immersed in a weakly alkaline aqueous solution such as 2 wt % aqueous solution of sodium metasilicate at room temperature, washed with warm water at about 40° C., optionally colored with a dye and then dried;

(3) The exposed material immersed in a weakly alkaline aqueous solution such as 2 wt % aqueous solution of sodium metasilicate at about 35° C., washed with water, optionally colored with a dye and then dried;

(4) The exposed material is immersed in an aqueous surfactant solution at room temperature, washed with warm water, optionally colored with a dye and then dried; or (5) The exposed film is immersed in an aqueous surfactant solution at about 35° C., washed with water, optionally colored with a dye and then dried.

As the dye, there may be suitably used a direct dye. As the surfactant, a nonionic or amphoteric surfactant may be used. The coating composition according to the present invention may be suitably used for the preparation of maps and secondary originals for machines, construction, plants, automobiles, airplanes and molds.

The following examples will further illustrate the present invention, in which parts are by weight.

EXAMPLE 1

In 90 parts of a mixed solvent composed 1:1 (by weight) ethanol and methyl ethyl ketone were dissolved 10 parts of mixed powder composed of 1:3 (by weight) a polyvinylpyrrolidone with a viscosity-average molecular weight of 630,000 (commercially available from GAF corp. as K-90) and another polyvinylpyrrolidone with a viscosity-average molecular weight of 40,000 (GAF corp., K-30). An ester (3 parts) obtained by reaction of 1,2-naphthoquinonediazide(2)-4-sulfonic chloride with a m-cresol novolak resin and a quantity of stannic chloride were dissolved in the above solution with stirring to obtain a photosensitive coating liquid. This coating liquid was then applied over one surface of a polyethylene terephthalate film (thickness: 100 $\mu$m) with a roll coater, and dried with hot air at 80° C. for 1 minute to form a photosensitive layer having a thickness of 2 $\mu$m. Seven kinds of photosensitive materials with different contents of stannic chloride as shown in Table 1 were thus obtained. These photosensitive materials were then tested for their tendency to be colored and sensitivity to development by the gray scale method as follows.

Gray Scale Method

Sample photosensitive film is overlaid with a positive original (KODAK PHOTOGRAPHIC STEP TABLET No. 2) and subjected to irradiation with UV rays using a 3 KW mercury lamp positioned at a distance of 1 m from the surface of the film. The irradiation is continued for 45 seconds to obtain an exposed film. The exposed film is immediately immersed in a 2% aqueous sodium methasilicate solution at 35° C. for development and then in Direct Fast Black (C.I. 27700) at 40° C. for 1 minute. The color density of the colored, developed image is measured using Macbeth Transmission Densitometer TD904 with Kodak Wratten Filter No. 18A. The thus obtained colored sample is washed with water and dried for determining the step number from the remaining gray scale of the developed film. This step number represents the sensitivity to development of the sample immediately after the exposure. The above procedure is repeated in the same manner as described except that the development is performed 6, 12 and 24 hours after the exposure. Namely, the exposed film has been allowed to stand at a temperature of 30° C. under a relative humidity of 80% for 6, 12 or 24 hours in the dark before it is immersed in the aqueous sodium metasilicate solution. The test results are summarized in Table 1.

TABLE 1

| Sample No. | 1* | 2 | 3 | 4 | 5 | 6 | 7 |
|---|---|---|---|---|---|---|---|
| Content of SnCl$_4$ (wt %) | 0 | 2 | 5 | 8 | 10 | 20 | 30 |
| Color Density | 3.10 | 3.15 | 3.11 | 3.10 | 3.11 | 3.11 | 3.16 |

TABLE 1-continued

| Sample No. | 1* | 2 | 3 | 4 | 5 | 6 | 7 |
|---|---|---|---|---|---|---|---|
| Sensitivity | | | | | | | |
| After 0 hour | 3 | 3 | 3 | 3 | 3 | 3 | 3 |
| After 6 hours | 0.5 | 2.5 | 2.5 | 3 | 3 | 3 | 3 |
| After 12 hours | 0.5 | 2 | 2.5 | 3 | 3 | 3 | 3 |
| After 24 hours | 0 | 1 | 1.5 | 3 | 3 | 3 | 3 |

*Comparative Sample

From the results shown in Table 1, it is appreciated that the photosensitive materials whose photosensitive layers contain a combination of the o-naphthoquinone diazide compound with the vinylpyrrolidone polymer can be colored with a direct dye. As long as the exposure is immediately followed by the development, these photosensitive materials exhibit the same sensitivity irrespective of their variations in content of stannic chloride. When there is an interval between the exposure and development, however, the sensitivity of the exposed surface of the photosensitive material using no stannic chloride (Sample No. 1) is considerably deteriorated. The deterioration of the sensitivity to development proceeds as the interval is increased. The effect of the addition of stannic chloride is thus apparent from the results shown in Table 1. The sensitivity to development of the photosensitive materials of Sample Nos. 4–7 remains unchanged even when the development is carried out after 24 hours from the exposure.

What is claimed is:

1. A composition for forming a photosensitive coating, comprising:
   (a) a photosensitive agent which is an o-naphthoquinone diazide compound,
   b) a polyvinylpyrrolidone compound and,
   (c) a stannic halide selected from the group consisting of $SnCl_4$ and $SnBr_4$, wherein said o-naphthoquinone diazide compound is present in an amount of 5–50 parts by weight per 100 parts by weight of said polyvinylpyrrolidone compound and said stannic halide is present in an amount of 4–40% based on the weight of said o-naphthoquinone diazide compound.

2. A composition as claimed in claim 1, further comprising an organic solvent in which said o-naphthoquinone diazide compound, said polyvinylpyrrolidone compound and said stannic halide are dissolved.

3. A composition as claimed in claim 1, wherein said o-naphthoquinone diazide compound is present in an amount of 15–35 parts by weight per 100 parts by weight of said polyvinylpyrrolidone compound and said stannic halide is present in an amount of 6–30% based on the weight of said o-naphthoquinone diazide compound.

4. A composition as claimed in claim 1, wherein said stannic halide is stannic chloride.

* * * * *